US007884392B2

(12) United States Patent
Lee et al.

(10) Patent No.: US 7,884,392 B2
(45) Date of Patent: Feb. 8, 2011

(54) IMAGE SENSOR HAVING THROUGH VIA

(76) Inventors: Hyuek-Jae Lee, 551-901, Sinnamusil 5-danji Apt., Yeongtong-dong, Yoongtong-gu, Suwon-si, Gyeonggi-do (KR); Tae-Je Cho, 523-1106, Samsung 5-cha Apt., Pungdeokeheon-dong, Suji-gu, Yongin-si, Gyeonggi-do (KR); Yong-Hwan Kwon, 104-406, Yeongtong 3-cha Poonglim Apt., 1093, Yoongtong-dong, Yeongtong-gu, Suwon-si, Gyeonggi-do (KR); Un-Byoung Kang, 408-1503, Shinycongtong Hyundai 4-cha Apt., Banwal-dong, Hwaseong-si, Gyeonggi-do (KR); Chung-Sun Lee, 414-1203, Halla 2-cha Apt., Ogeum-dong, Gunpo-si, Gyeonggi-do (KR); Woon-Seong Kwon, 201-412, CJ Nine Park, 24-6, Munbac-dong, Yongsan-gu, Seoul (KR); Hyung-Sun Jang, Rm. 302, 140-27, Maeian-dong, Yeongtong-gu, Suwon-si, Gyeonggi-do (KR)

( * ) Notice: Subject to any disclaimer, the term of this patent is extended or adjusted under 35 U.S.C. 154(b) by 105 days.

(21) Appl. No.: 12/362,210

(22) Filed: Jan. 29, 2009

(65) Prior Publication Data
US 2009/0200632 A1 Aug. 13, 2009

(30) Foreign Application Priority Data
Jan. 29, 2008 (KR) .................. 10-2008-0009058

(51) Int. Cl.
*H01L 31/0328* (2006.01)
(52) U.S. Cl. ............... 257/184; 257/258; 257/433; 257/621; 257/690; 257/E31.058

(58) Field of Classification Search .......... 257/184, 257/433, 621, 680, 690, 701, 258
See application file for complete search history.

(56) References Cited

U.S. PATENT DOCUMENTS

| 2003/0214595 A1* | 11/2003 | Mabuchi ................ 348/294 |
| 2005/0056903 A1* | 3/2005 | Yamamoto et al. ........ 257/433 |
| 2008/0290438 A1* | 11/2008 | Weng et al. ............ 257/434 |
| 2009/0068798 A1* | 3/2009 | Oliver et al. ........... 438/127 |

FOREIGN PATENT DOCUMENTS

| JP | 2004-055674 | 2/2004 |
| JP | 2007-184680 | 7/2007 |
| JP | 2007-189198 | 7/2007 |

OTHER PUBLICATIONS

English language abstract of Japanese Publication No. 2004-055674.
English language abstract of Japanese Publication No. 2007-184680.
English language abstract of Japanese Publication No. 2007-189198.

* cited by examiner

*Primary Examiner*—Wai-Sing Louie (57) ABSTRACT

One embodiment exemplarily described herein can be characterized as an image sensor including a substrate having a front surface and a rear surface; a photoelectric converting portion on the front surface of the substrate; a through via extending through the substrate, wherein the through via is electrically connected to the photoelectric converting portion; an external connection terminal on the rear surface of the substrate, wherein the external connection terminal is connected to the through via; and a light shading layer formed on a portion of the rear surface of the substrate, wherein the light shading layer is substantially opaque with respect to an external light. In some embodiments, the portion of the rear surface of the substrate on which the light shading layer is formed is not overlapped by the through via or the external connection terminal.

20 Claims, 5 Drawing Sheets

IMAGE SENSOR HAVING THROUGH VIA

CROSS-REFERENCE TO RELATED PATENT APPLICATION

This application claims the benefit of Korean Patent Application No. 10-2008-0009058, filed on Jan. 29, 2008, the disclosure of which is incorporated herein in its entirety by reference.

BACKGROUND

Embodiments of inventive concepts exemplarily described herein relate to image sensors, and more particularly, to an image sensor having through vias.

SUMMARY

Embodiments of some inventive concepts exemplarily described herein include an image sensor in which malfunction or noise generated by external light being transmitted through the substrate from a rear side thereof to a photoelectric converting portion is substantially prevented.

Embodiments of some inventive concepts exemplarily described herein also include an image sensor having an increased mechanical reliability of wire pads and external connection terminals for electrically connecting to an external apparatus.

One embodiment exemplarily described herein can be characterized as an image sensor including a substrate having a front surface and a rear surface; a photoelectric converting portion on the front surface of the substrate; a through via extending through the substrate, wherein the through via is electrically connected to the photoelectric converting portion; an external connection terminal on the rear surface of the substrate, wherein the external connection terminal is connected to the through via; and a light shading layer formed on a portion of the rear surface of the substrate, wherein the light shading layer is substantially opaque with respect to an external light.

Another embodiment exemplarily described herein can be characterized as an image sensor including a substrate having a front surface and a rear surface; a photoelectric converting portion located on the front surface of the substrate; a connection pad located on the front surface of the substrate, wherein the connection pad is electrically connected to the photoelectric converting portion; a through via hole extending through the substrate, wherein the connection pad is exposed within the through via hole; a light shading layer located on a portion of the rear surface of the substrate, wherein the light shielding layer is substantially opaque to an external light; an insulating layer located on a portion of the rear surface of the substrate where the light shading layer is not located, on a sidewall of the through via hole, and on a surface of the light shading layer; a through via located on the insulating layer on the rear surface of the substrate, wherein the through via is connected to the connection pad; a wire pad formed on the insulating layer, wherein the wire pad is connected to the through via; and an external connection terminal located on the wire pad.

Yet another embodiment exemplarily described herein can be characterized as an image sensor including a substrate having a first surface and a second surface opposite the first surface; a photoelectric converting portion formed on a first region of the first surface; a light shading layer formed on a second region of the second surface opposite the first region of the first surface, wherein a first portion of the second region of the second surface is covered by the light shielding layer and wherein a second portion of the second region of the second surface is exposed by the light shielding layer; and a wire pad formed on the second portion of the second region of the second surface, wherein the wire pad is insulated from light shading layer, wherein the wire pad is electrically connected to the photoelectric converting portion, and wherein the light shading layer and the wire pad are substantially opaque to an external light.

BRIEF DESCRIPTION OF THE DRAWINGS

The above and other features of embodiments of inventive concepts exemplarily described herein will become more apparent with reference to the attached drawings in which.

DETAILED DESCRIPTION

Exemplary embodiments of inventive concepts will now be described more fully with reference to the accompanying drawings. These embodiments may, however, be realized in many different forms and should not be construed as being limited to the description set forth herein; rather, these embodiments are provided so that this disclosure will be thorough and complete, and will fully convey the concept of the invention to those skilled in the art. In the drawings, like reference numerals in the drawings denote like elements, and thus their description will be omitted.

According to some embodiments, an image sensor can be generally characterized as including a light shading layer that is substantially opaque with respect to external light, to substantially reduce or prevent the transmission of external light to a photoelectric converting portion through a substrate, from a rear surface of the substrate. The image sensor may, for example, include a light shading layer located on a portion of the rear surface of the substrate. Therefore, the light shading layer may be located on a portion of the rear surface of the substrate, but not on a portion of the rear surface of the substrate that is overlapped by external connection terminals, through vias, or wire pads.

According to some embodiments, the light shading layer of the image sensor may be partially overlapped by the external connection terminals, through vias and/or wire pads. However, in other embodiments, the light shading layer is not overlapped by the external connection terminals, the through vias, or the wire pads. The external connection terminals, through vias and wire pads may, in addition to the light shading layer, be substantially opaque with respect to external light. As a result, the transmission of external light to a photoelectric converting portion through a substrate, from a rear surface of the substrate, may be substantially reduced or prevented by the external connection terminals, the through vias, the wire pads, and the light shading layer. In one embodiment, the external connection terminals, the through vias, the wire pads, and the light shading layer may absorb external light transmitted through the substrate from a front surface thereof so that external light transmitted through the substrate from a front surface thereof is not reflected back to the photoelectric converting portion. Accordingly, generation of malfunctions and noise in the image sensor can be substantially reduced or prevented.

According to some embodiments, an insulating layer may be formed on the rear surface of the substrate and on the light shading layer. In such embodiments, the wire pads of the image sensor may be formed on a portion of the insulating layer that is formed on the rear surface of the substrate, and the external connection terminals may be formed on the wire pads. As a result, the image sensor according can be generally characterized as having a stacked structure in which the insulating layer, the wire pads, and the external connection terminals are sequentially stacked on the rear surface of the substrate. In the aforementioned stacked structure, the insulating layer is interposed between the rear surface of the substrate and the wire pads/external connection terminals. As a result, a mechanical reliability of the wire pads and the external connection terminals for electrically connecting to an external apparatus can be greatly increased. An image sensor according to embodiments of some inventive concepts will now be described in detail with reference to the accompanying drawings. As mentioned above, the accompanying drawings do not include the entire scope of the present invention as defined by the claims, but are only examples.

Figure 1:
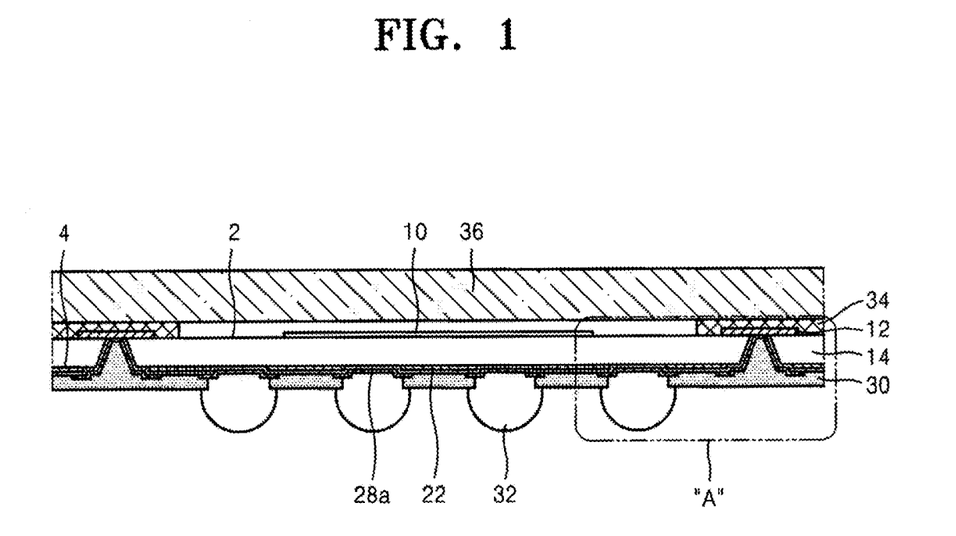
FIG. 1 is a cross-sectional view of an image sensor according to one embodiment.
Figure 2:
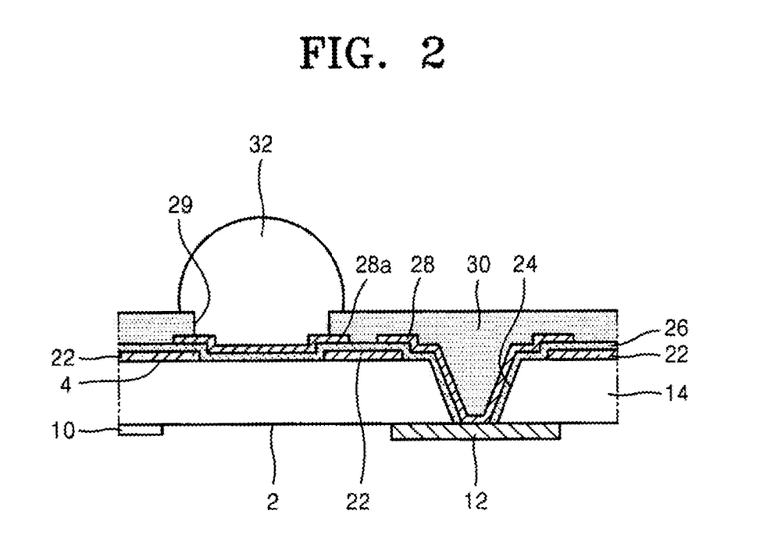
FIG. 2 is a magnified cross-sectional view of the image sensor shown in portion "A" of FIG. 1.

FIG. 1 is a cross-sectional view of an image sensor according to one embodiment. FIG. 2 is a magnified cross-sectional view of the image sensor shown in portion "A" of FIG. 1 and FIG. 3 is a magnified view of a rear surface of the image sensor shown in FIG. 1.

Figure 3:
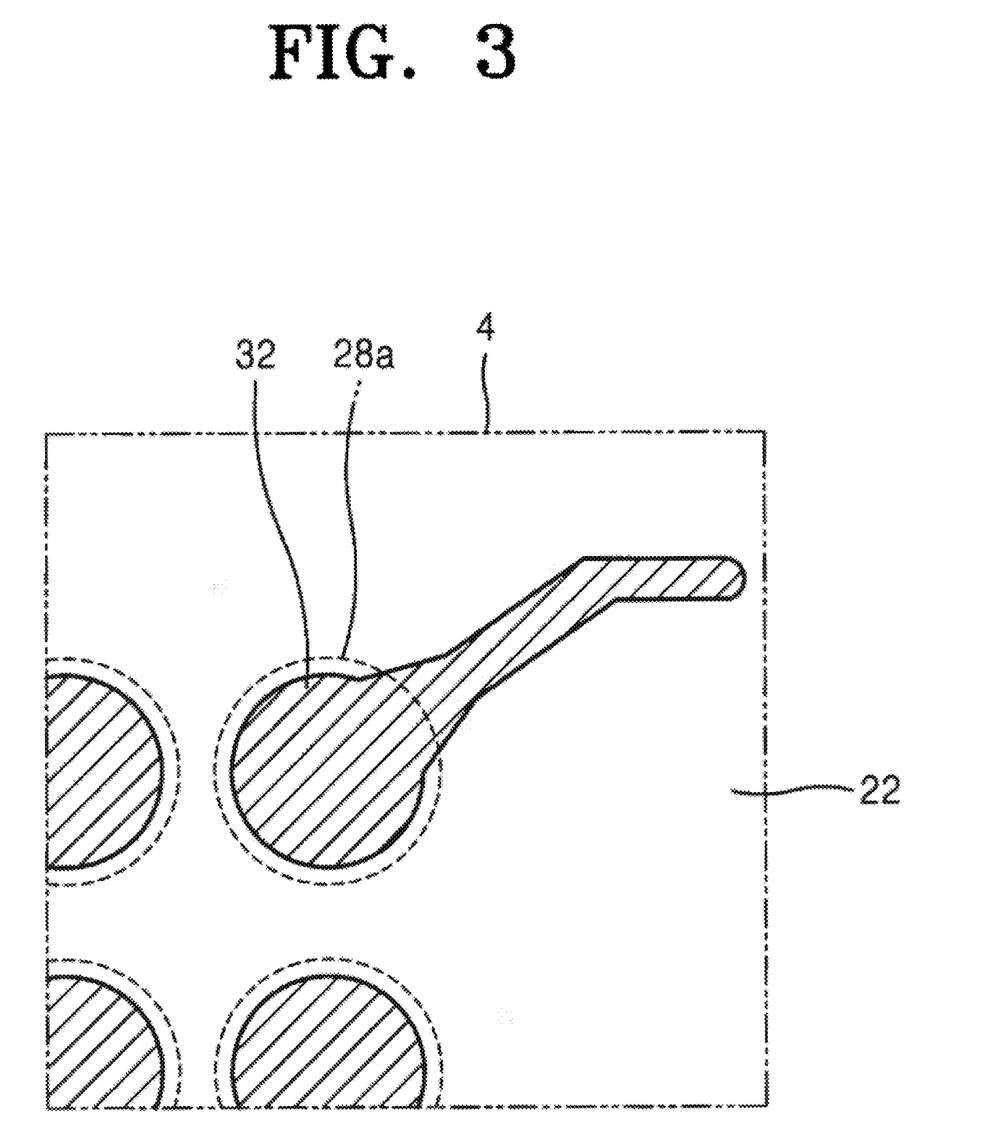
FIG. 3 is a magnified view of a rear surface of the image sensor shown in FIG. 1.

Referring to FIGS. 1 through 3, an image sensor according to an embodiment may, for example, include a photoelectric converting portion 10 that converts an optical image to an electrical signal on a front surface 2 of a substrate 14. The photoelectric converting portion 10 may be formed on a central region of the front surface 2 of the substrate 14. The substrate 14 may, for example, include a silicon substrate having a thickness of about 100 µm or less. As described above, the photoelectric converting portion 10 may include a plurality of MOS capacitors or a plurality of photodiodes and MOS transistors. The photoelectric converting portion 10 may include a light receiving device. The photoelectric converting portion 10 may be one suitable for being formed on the front surface 2 of the substrate 14 or one suitable for being configured by stacking in a chip structure.

As illustrated, the image sensor may further include connection pads 12, through vias 28, wire pads 28a, and external connection terminals 32 to transmit or receive electrical signals. The connection pads 12 are electrically connected to the photoelectric converting portion 10. The connection pads 12 may be connected to chip pads (not shown) of the photoelectric converting portion 10.

As illustrated, the through vias 28 may be formed through opposing side portions of the substrate 14 of the photoelectric converting portion 10. Each of the through vias 28 and the wire pads 28a may include a metal layer configured as a single film or a composite film formed of a material such as Cr, Ti, Al, or the like or a combination thereof. Each of the through vias 28 and the wire pads 28a may be provided as a redistribution layer redistributed on a rear surface of the substrate 14.

The through vias 28 may be formed on side walls of through via holes 24 that pass through the substrate 14. Accordingly, the through via holes 24 are formed in the substrate 14 to correspond to the connection pads 12, and the connection pads 12 formed on the front surface 2 of the substrate 14 are connected to the through vias 28. The connection pads 12 are formed on both side portions of the substrate 14.

The through vias 28 and the wire pads 28a may be electrically connected together and include a metal layer configured as a single film or a composite film. Adhesive layers 34 are formed on the connection pads 12. An optical transmission substrate 36 is attached to an upper surface of the substrate 14 using the adhesive layers 34. Accordingly, the adhesive layers 34 may be formed at opposing side portions of a surface of the optical transmission substrate 36, and the optical transmission substrate 36 may be attached to the front surface 2 of the substrate 14 of the photoelectric converting portion 10 using the adhesive layers 34. The optical transmission substrate 36 may include a transparent material or a semi-transparent material such as glass, quartz, or the like or a combination thereof.

In the illustrated embodiment, the image sensor may include a light shading layer 22 formed on a portion of the rear surface 4 of the substrate 14. The light shading layer 22 may include at least one metal layer. The light shading layer 22 may be configured as a single film or a composite film formed of a material such as Cr, Ti, Al, or the like or a combination thereof. In FIG. 2, for convenience of explanation, it is depicted that the rear surface 4 of the substrate 14 is disposed to be arranged at the upper side of the drawing. The light shading layer 22 is disposed on the rear surface 4 of the substrate 14 and is substantially opaque with respect to external light to substantially reduce or prevent the transmission of external light to the photoelectric converting portion 10 through the substrate 14, from the rear surface 4 of the substrate 14.

As depicted in FIGS. 1 through 3, the light shading layer 22 is formed on a portion of the rear surface 4 of the substrate 14, and is not formed over the entire rear surface 4 of the substrate 14. That is, the light shading layer 22 may be selectively formed on a portion the rear surface 4 of the substrate 14 such that the portion of the rear surface 4 of the substrate 14 that is overlapped by the light shading layer 22 is not overlapped by the external connection terminals 32 or the through vias 28. In another embodiment, the light shading layer 22 may be selectively formed on a portion the rear surface 4 of the substrate 14 such that the portion of the rear surface 4 of the substrate 14 that is overlapped by the light shading layer 22 is not overlapped by the external connection terminals 32, the through vias 28, or the wire pads 28a. The external connection terminals 32, the wire pads 28a, and the through vias 28 may be substantially opaque with respect to external light to substantially reduce or prevent the transmission of external light to the photoelectric converting portion 10 through the substrate 14, from the rear surface 4 of the substrate 14. Thus, the external connection terminals 32, the wire pads 28a, and the through vias 28 may perform the same function as light shading layer 22. In one embodiment, the light shading layer 22 may be partially overlapped by the external connection terminals 32, the through vias 28 and/or the wire pads 28a. In another embodiment, however, the light shading layer 22 is not overlapped by the external connection terminals 32, the through vias 28, or the wire pads 28a. As a result, the transmission of external light to the photoelectric converting portion 10 through the substrate 14, from the rear surface 4 of the substrate 14, can be substantially reduced or prevented.

Referring to FIG. 2, the image sensor may further include an insulating layer 26. The insulating layer 26 may be formed on entire surfaces of side walls of the through via hole 24, the rear surface 4 of the substrate 14, and the light shading layer 22. However, the insulating layer 26 is not formed on the connection pad 12. The through via 28 is formed on a portion of the insulating layer 26 disposed on the side walls of the through via hole 24 and is also formed on a portion of the insulating layer 26 disposed on the rear surface 4 of the substrate 14, while being connected to the connection pad 12.

The through via 28 may be also formed on a portion of the insulating layer 26 disposed on the side walls of the through via hole 24 and may also be formed on a portion of the insulating layer 26 disposed on the light shading layer 22 adjacent to the through via hole 24. The wire pad 28a may be selectively formed on the insulating layer 26 on the rear surface 4 of the substrate 14. The wire pad 28a may also be formed on a portion of the insulating layer 26 disposed on the light shading layer 22. The through via 28 and the wire pad 28a may be electrically connected to each other.

An external connection terminal 32 that can be connected to an external device is formed on the wire pad 28a. Accordingly, the image sensor may further include a mask layer 30 having a hole 29 extending therethrough. The mask layer 30 covers the through via hole 24 and the hole 29 exposes the wire pad 28a. The external connection terminal 32 is formed on the wire pad 28a and fills the hole 29.

In the image sensor having the above-described structure, the transmission of external light through the substrate 14, from the rear surface 4 of the substrate 14, is substantially reduced or prevented due to the presence of the light shading layer 22 as well as the external connection terminals 32, the through vias 28 and the wire pads 28a. Accordingly, the generation of malfunctions and noise in the image sensor can be substantially reduced or prevented.

Also, in the image sensor according to the illustrated embodiment, the light shading layer 22 is not formed on the entire rear surface 4 of the substrate 14. Rather, the light shading layer 22 is selectively formed on a portion of the rear surface 4 of the substrate 14 that is not overlapped by the external connection terminal 32, the hole 29 or the wire pad 28a. Because the light shading layer 22 is not formed on the entire rear surface 4 of the substrate 14, stress is not applied to the entire surface of the substrate 14 and a problem of scaling off of the light shading layer 22 does not occur. As a result, an adhesive reliability between the light shading layer 22 and the substrate 14 may be increased.

Also, as depicted in FIG. 2, the image sensor according to the illustrated embodiment has a stacked structure, in which the insulating layer 26, the wire pad 28a, the light shading layer 22, and the external connection terminal 32 are sequentially stacked on the substrate 14, as a structure to connect to an external device. The insulating layer 26 is formed on the rear surface 4 of the substrate 14 on which the light shading layer 22 is not formed, on both side walls of the through via hole 24, and on a surface of the light shading layer 22. Thus, the insulating layer 26 prevents a short circuit between the through via 28 and the light shading layer 22 and between the through via 28 and the substrate 14.

Accordingly, the image sensor according to the illustrated embodiment can be generally characterized as having a stacked structure in which the insulating layer 26, the wire pad 28a, and the external connection terminal 32 are sequentially stacked on the rear surface 4 of the substrate 14. Because the stacked structure is formed by interposing the insulating layer 26 between the rear surface 4 of the substrate 14 and the stacked wire pad 28a/external connection terminal 32, the mechanical reliability between the wire pad 28a and the external connection terminal 32 for connecting to an external device may be greatly increased. The image sensor according to the illustrated embodiment can be employed in mobile phones, digital cameras, display devices, and various types of camera modules.

Figure 4:
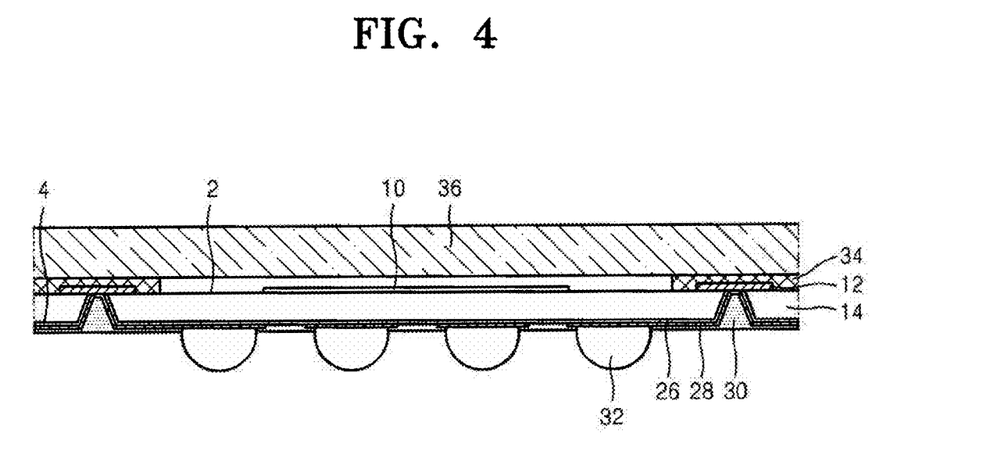
FIG. 4 is a cross-sectional view of an exemplary comparative image sensor, for comparison with the image sensor shown in FIG. 1.
Figure 5:
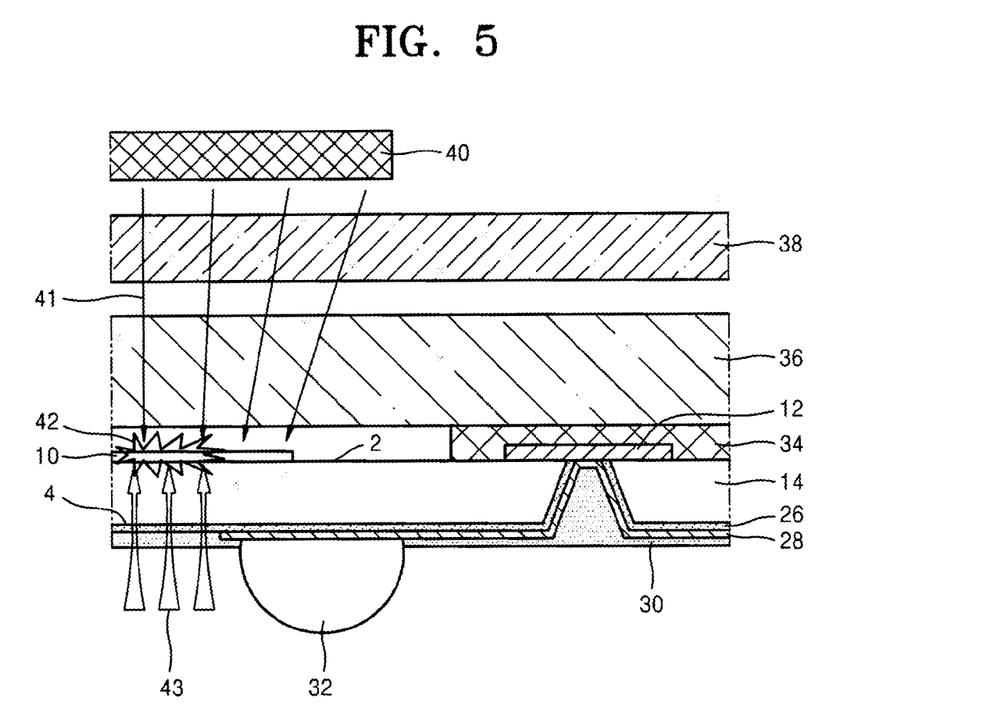
FIG. 5 is a portion of magnified cross-sectional view illustrating a problem caused during operation of the exemplary comparative image sensor shown in FIG. 4.

FIG. 4 is a cross-sectional view of an exemplary comparative image sensor, for comparison with the image sensor shown in FIG. 1. FIG. 5 is a partially magnified cross-sectional view of FIG. 4 for explaining problems causing during operation of the exemplary comparative image sensor shown in FIG. 4.

In FIGS. 4 and 5, like reference numerals indicate like elements in FIGS. 1 through 3. The image sensor shown in FIG. 4 is identical to the image sensor of FIG. 1, except that the image sensor shown in FIG. 4 does not include the light shading layer 22 shown in FIGS. 1 through 3. Referring to FIG. 5, a lens 38 and an object 40 are located on an optical transmission substrate 36. External light 41 reflected by the object 40 is incident to a photoelectric converting portion 10 to form an optical image.

However, in the exemplary comparative image sensor, as depicted in FIG. 5, external light 43 is transmitted through a substrate 14 from a rear surface 4 of the substrate 14. The external light 43 is incident to the photoelectric converting portion 10. As a result, various patterns (e.g., wire patterns formed on the rear surface 4 of the substrate 14) are cast onto the photoelectric converting portion 10 as indicated by reference numeral 42, resulting in an adverse affect to the photoelectric converting portion 10. Consequently, the generation of malfunctions and noise in the exemplary comparative image sensor is can be substantially reduced or prevented. The exemplary comparative image sensor may malfunction and cause noise.

FIGS. 6 through 10 are cross-sectional views illustrating one embodiment of a method of fabricating the image sensor shown in FIGS. 1 through 3. In FIGS. 6 through 10, for convenience of explanation, a rear surface 4 of a substrate 14 is depicted at an upper side of the drawings.

Figure 6:
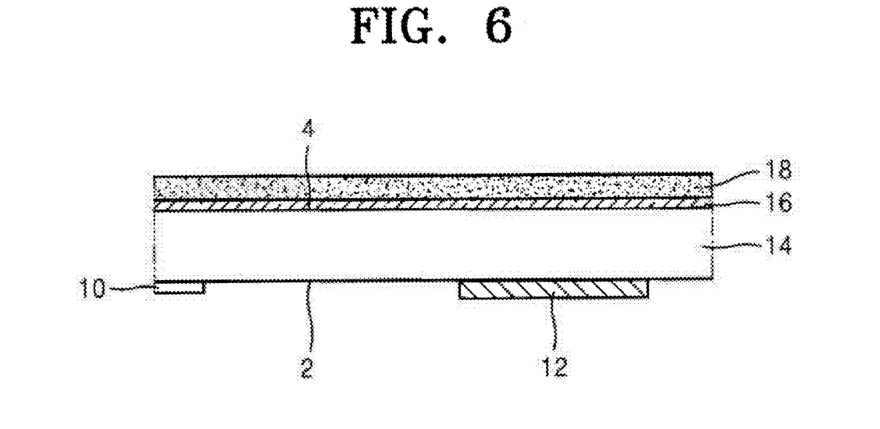
FIGS. 6 through 10 are cross-sectional views illustrating one embodiment of a method of fabricating the image sensor shown in FIGS. 1 through 3.

Referring to FIG. 6, a light shading material layer 16 is formed on the rear surface 4 of the substrate 14 having a photoelectric converting portion 10 and a connection pad 12 on a front surface 2 thereof. The light shading material layer 16 includes at least one metal film having a thickness of about 0.1 µm to about 1 µm. The light shading material layer 16 includes a single film or a composite film formed of a material such as Cr, Ti, Al, or the like or a combination thereof. The light shading material layer 16 may be formed using, for example, a sputtering method. A first photoresist layer 18 is formed on the light shading material layer 16. Although not shown, an optical transmission substrate 36 may be attached to the substrate 14 so as to overlap with the photoelectric converting portion 10 by via an adhesive layer 34 (not shown) disposed on the connection pad 12.

Figure 7:
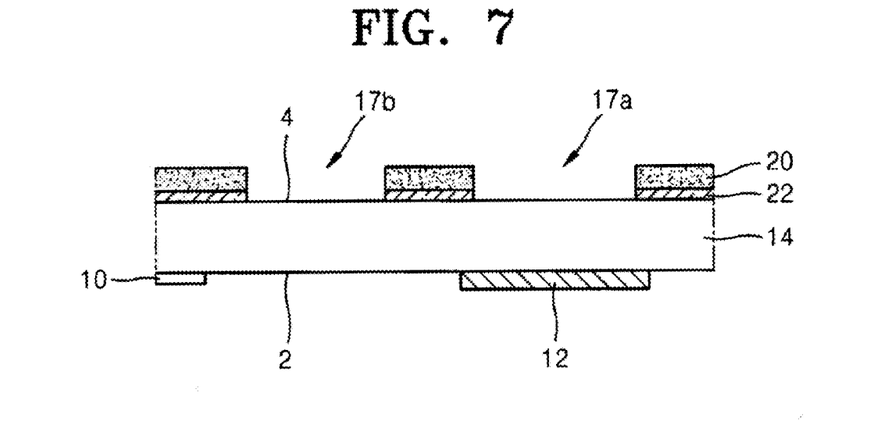

Referring to FIG. 7, a first photoresist pattern 20 is formed by patterning the first photoresist layer 18. A light shading layer 22 that exposes portions 17a and 17b of the rear surface 4 of the substrate 14 (e.g., where a wire pad 28a and a through via 28, respectively, will be subsequently formed) is formed by patterning the light shading material layer 16 using the first photoresist pattern 20 as a mask.

That is, portions of the light shading material layer 16 in the portion 17a, where the wire pad 28a will be subsequently formed, and the light shading material layer 16 in the portion 17b, where the through via 28 will be subsequently formed, are etched. Through the above-described process, the light shading layer 22 is formed partly on the rear surface 4 of the substrate 14. As described above, the light shading layer 22 substantially opaque to external light to substantially reduce or prevent the transmission of external light to the photoelectric converting portion 10 through the substrate 14, from the rear surface 4 of the substrate 14.

Figure 8:
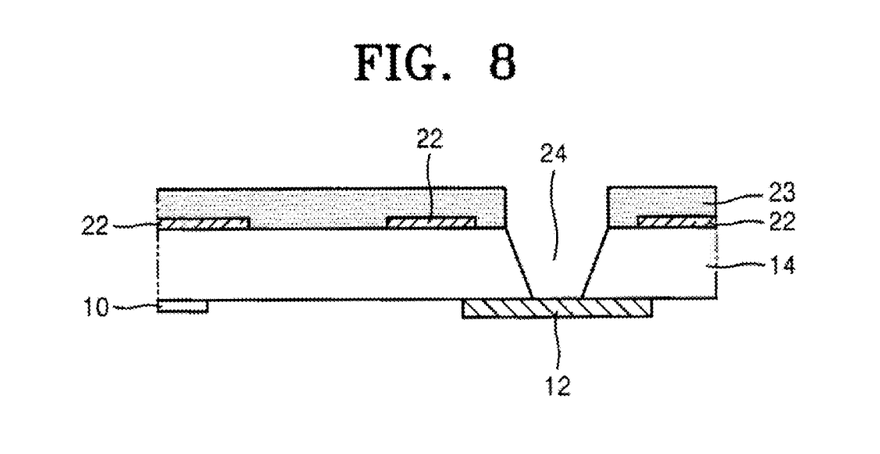

Referring to FIG. 8, the first photoresist pattern 20 is removed and a second photoresist pattern 23 is subsequently formed to expose a portion 17a where the through via 28 will be subsequently formed. The second photoresist pattern 23 is formed by forming a second photoresist layer (not shown) on the entire rear surface 4 of the substrate 14 on which the light shading layer 22 is formed and patterning the second photoresist layer. A through via hole 24 is formed by etching the substrate 14 using the second photoresist pattern 23 as a mask. The connection pad 12 is exposed by the through via hole 24.

Figure 9:
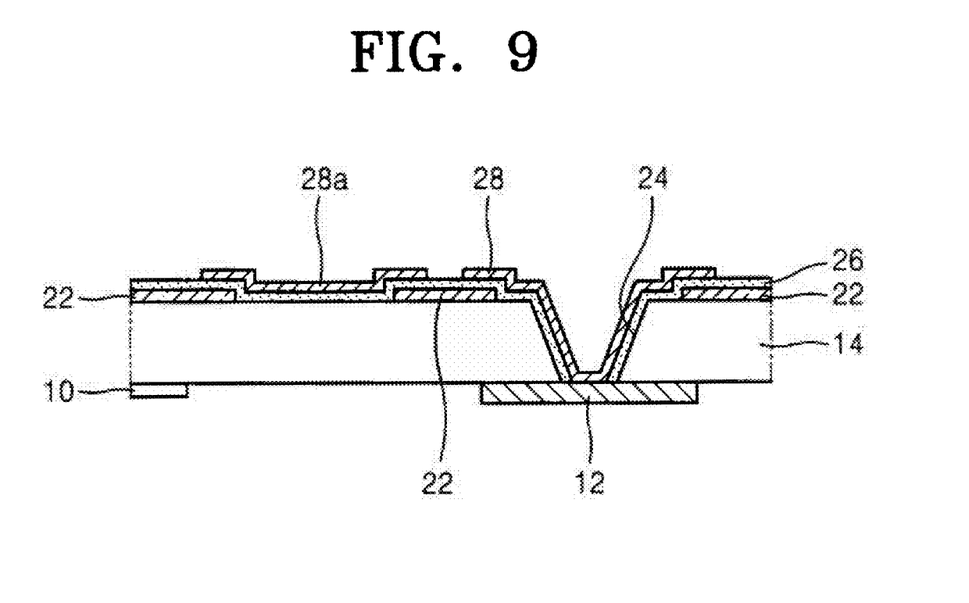

Referring to FIG. 9, the second photoresist pattern 23 is removed. An insulating layer 26 is then formed to a thickness of about 0.5 µm to about 5 µm on the light shading layer 22, the through via hole 24, and the entire rear surface 4 of the substrate 14. The insulating layer 26 may, for example, include a single film or a double film including a material such as an oxide, a nitride, or the like or a combination thereof. If the substrate 14 is a silicon substrate, the oxide may include a material such as silicon oxide, or the like, and the nitride may include a material such as silicon nitride, or the like. The insulating layer 26 may prevent a short circuit between the through via 28 and the light shading layer 22 or between the through via 28 and the substrate 14.

Next, a portion of the insulating layer 26 in the through via hole 24 is etched to expose the connection pad 12. The through via 28 connected to the connection pad 12 is then formed on the insulating layer 26 in the through via hole 24, and a wire pad 28a is formed on the insulating layer 26 in the portion 17b.

Figure 10:
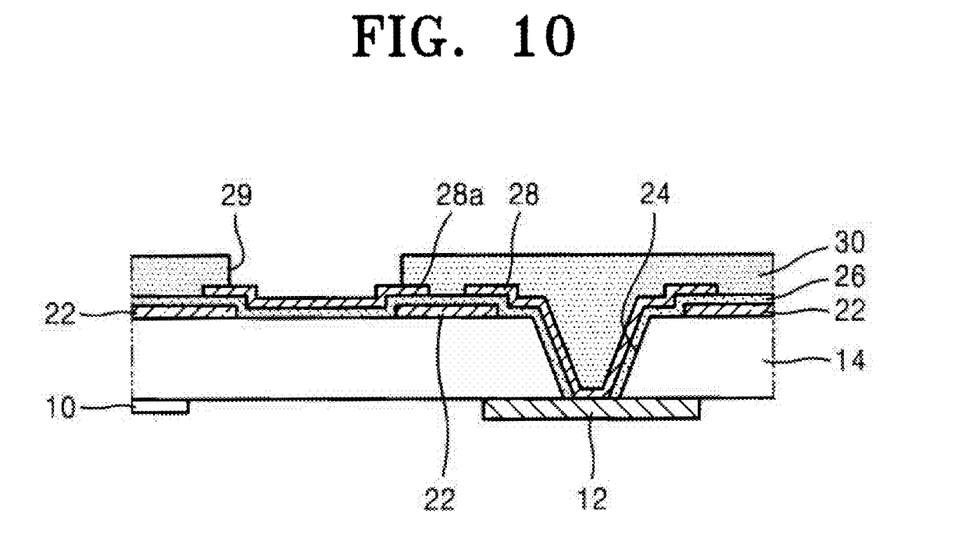

Referring to FIG. 10, a solder resist layer (not shown) is formed on the entire rear surface 4 of the substrate 14 and a mask layer 30 having a hole 29 that exposes the wire pad 28a is formed by patterning the solder resist layer. As depicted in FIG. 2, the manufacture of an external connection terminal 32 may be performed by attaching a solder ball to the wire pad 28a using the mask layer 30 as a mask.

According to the embodiments exemplarily described above, an image sensor includes a light shading layer formed on a portion of a rear surface of a substrate. Because the light shading layer, the external connection terminals, the through vias, and the wire pads of the image sensor are substantially opaque to external light, transmission of the external light to the photoelectric converting portion through the substrate from the rear surface thereof is substantially reduced or prevented. Consequently, generation of malfunctions and noise in the image sensor can be substantially reduced or prevented.

According to the embodiments exemplarily described above, the image sensor has a stacked structure in which an insulating layer, wire pads, and external connection terminals are sequentially stacked on the rear surface of the substrate. In the stacked structure, the insulating layer is interposed between the rear surface of the substrate and the wire pads/external connection terminals for electrically connecting to external devices. Therefore the mechanical reliability of the wire pads and the external connection terminals can be greatly increased.

Embodiments of the inventive concepts exemplarily described herein can be practiced in many ways. What follows is a non-limiting discussion of some exemplary embodiments.

According to one embodiment, there is provided an image sensor comprising: a photoelectric converting portion formed on a surface of a substrate; a plurality of through vias formed through the substrate to transmit an electrical signal of the photoelectric converting portion; a plurality of external connection terminals connected to the through vias on a rear surface of the substrate; and a light shading layer that is partly formed on the rear surface of the substrate to block external light being transmitted through from a rear side of the substrate to the photoelectric converting portion.

According to another embodiment, there is provided an image sensor comprising: a photoelectric converting portion formed on a surface of a substrate; a plurality of connection pads formed on the surface of the substrate to transmit an electrical signal of the photoelectric converting portion; a plurality of through vias connected to the connection pads through the substrate; a plurality of wire pads connected to the through vias; a plurality of external connection terminals formed on the wire pads; and a light shading layer that is partly formed on the rear surface of the substrate to block external light being transmitted through from a rear side of the substrate to the photoelectric converting portion.

According to yet another embodiment, there is provided an image sensor comprising: a photoelectric converting portion formed on a surface of a substrate; a plurality of connection pads formed on the surface of the substrate to transmit an electrical signal of the photoelectric converting portion; a plurality of through via holes formed through the substrate under the connection pads; a light shading layer that is partly formed on a rear surface of the substrate to block external light being transmitted through from a rear side of the substrate to the photoelectric converting portion; an insulating layer formed on portions of the rear surface of the substrate at which the light shading layer is not formed, on both sidewalls of the through via holes, and on a surface of the light shading layer; a plurality of through vias formed on the insulating layer on the rear surface of the substrate and connected to the connection pads; a plurality of wire pads formed on the insulating layer and connected to the through vias; and a plurality of external connection terminals formed on the wire pads.

While embodiments of the inventive concepts have been exemplarily shown and described, it will be understood by those of ordinary skill in the art that various changes in form and details may be made therein without departing from the spirit and scope of the present invention as defined by the following claims.

What is claimed is:

1. An image sensor comprising:
   a substrate having a front surface and a rear surface, wherein the front surface of the substrate includes a first region and a second region, wherein the rear surface of the substrate includes a first region, a second region, and a third region, and wherein the second region of the front surface of the substrate is opposite the second region of the rear surface of the substrate;
   a photoelectric converting portion located in the first region of the front surface of the substrate;
   a through via extending through the substrate, wherein the through via is electrically connected to the photoelectric converting portion, and is located in the second region of the rear surface of the substrate;
   a connection pad located in the second region of the front surface of the substrate, wherein the connection pad is electrically connected to the photoelectric converting portion, and wherein a width of the connection pad defines the boundaries of the second region of the rear surface of the substrate;

an external connection terminal located in the third region of the rear surface of the substrate, wherein the external connection terminal is connected to the through via; and a light shading layer formed at least in the first region of the rear surface of the substrate, wherein the light shading layer is substantially opaque with respect to an external light, and wherein the light shading layer is also formed in the second region of the rear surface of the substrate, such that the light shading layer extends through part of the second region of the rear surface of the substrate, but does not extend entirely throughout the second region of the rear surface of the substrate.

2. The image sensor of claim 1, further comprising an insulating layer interposed between the through via and the light shading layer.

3. The image sensor of claim 1, wherein the light shading layer includes at least one metal layer.

4. The image sensor of claim 1, wherein the through via includes a metal layer that is substantially opaque with respect to the external light.

5. The image sensor of claim 1, wherein the photoelectric converting portion is formed in a central region of front surface of the substrate and the through via is formed outside the central region.

6. The image sensor of claim 1, further comprising:
an adhesive layer formed on the front surface of the substrate between the photoelectric converting portion and a side end of the substrate; and
an optical transmission substrate attached to the adhesive layer, wherein the optical transmission substrate overlaps the photoelectric converting portion.

7. The image sensor of claim 1, wherein the substrate includes a silicon substrate.

8. The image sensor of claim 1, further comprising:
a wire pad connected to the through via,
wherein the external connection terminal is located on the wire pad and is electrically connected to the through via by the wire pad.

9. The image sensor of claim 8, wherein extends through at least part of the third region.

10. The image sensor of claim 8, wherein the through via and the wire pad include a metal layer that is substantially opaque to the external light.

11. The image sensor of claim 8, further comprising an insulating layer interposed between the rear surface of the substrate and the wire pad.

12. An image sensor comprising:
a substrate having a front surface and a rear surface;
a photoelectric converting portion located on the front surface of the substrate;
a connection pad located on the front surface of the substrate, wherein the connection pad is electrically connected to the photoelectric converting portion;
a through via hole extending through the substrate, wherein the connection pad is exposed within the through via hole;
a light shading layer located on a portion of the rear surface of the substrate, wherein the light shading layer is substantially opaque to an external light;
an insulating layer located on a portion of the rear surface of the substrate where the light shading layer is not located, on a sidewall of the through via hole, and on a surface of the light shading layer;
a through via located on the insulating layer on the rear surface of the substrate, wherein the through via is connected to the connection pad;
a wire pad formed on the insulating layer, wherein the wire pad is connected to the through via; and
an external connection terminal located on the wire pad,
wherein the insulating layer is interposed between the light shading layer and the through via.

13. The image sensor of claim 12, further comprising a mask layer covering the through via hole, wherein the mask layer includes a hole exposing the wire pad and wherein the external connection terminal fills the hole.

14. The image sensor of claim 12, wherein the insulating layer, the wire pad and the external connection terminal are stacked on the rear surface of the substrate.

15. The image sensor of claim 12, wherein the insulating layer comprises at least one film formed of an oxide, a nitride or a combination thereof.

16. The image sensor of claim 12, wherein the portion of the rear surface of the substrate on which the light shading layer is formed is not overlapped by the through via, the external connection terminal or the wire pad.

17. The image sensor of claim 12, wherein the through via is located on a portion of the insulating layer disposed in the through via hole and located on a portion of the insulating layer disposed on the light shading layer adjacent to the through via hole.

18. The image sensor of claim 12, wherein the wire pad is located on a portion of the insulating layer disposed on the light shading layer.

19. An image sensor comprising:
a substrate having a first surface and a second surface opposite the first surface;
a photoelectric converting portion formed on a first region of the first surface;
a through via extending through the substrate, wherein the through via is electrically connected to the photoelectric converting portion;
a light shading layer formed on a second region of the second surface opposite the first region of the first surface, wherein a first portion of the second region of the second surface is covered by the light shading layer and wherein a second portion of the second region of the second surface is not covered by the light shading layer; and
a wire pad formed on the second portion of the second region of the second surface, wherein the wire pad is insulated from the light shading layer by an insulating layer,
wherein the wire pad is electrically connected to the photoelectric converting portion,
wherein the light shading layer and the wire pad are substantially opaque to an external light, and
wherein the insulating layer is interposed between the light shading layer and the through via.

20. The image sensor of claim 19, wherein the wire pad is outside the first portion of the second region of the second surface.

* * * * *